United States Patent [19]
Banker et al.

[11] Patent Number: 5,317,208
[45] Date of Patent: May 31, 1994

[54] INTEGRATED CIRCUIT EMPLOYING INVERSE TRANSISTORS

[75] Inventors: Dennis C. Banker, Newburgh; Tore A. Carlson, Brewster; Jack A. Dorler, Holmes, all of N.Y.; Paul D. Hendricks, Whitehall, Pa.; Walter S. Klara, Hopewell Junction, N.Y.; Frank M. Masci, Wappingers Falls, N.Y.; James R. Struk, Poughkeepsie, N.Y.

[73] Assignee: International Business Machines Corporation, Armonk, N.Y.

[21] Appl. No.: 881,595

[22] Filed: May 12, 1992

[51] Int. Cl.⁵ .......................................... H03K 19/013
[52] U.S. Cl. .................................. 307/454; 323/315; 257/579
[58] Field of Search ....... 307/454, 296.6, 299.2-299.3; 323/312, 315, 317; 257/579

[56] References Cited

U.S. PATENT DOCUMENTS

| | | | |
|---|---|---|---|
| 4,438,353 | 3/1984 | Sano | 307/296.6 |
| 4,585,962 | 4/1986 | Sasayama | 257/579 |
| 4,642,483 | 2/1987 | Tomita | 307/296.6 |
| 4,668,879 | 5/1987 | Dansky et al. | 307/454 |
| 4,767,945 | 8/1988 | Quinn | 307/299.2 |
| 4,890,052 | 12/1989 | Hellums | 323/315 |
| 5,144,223 | 9/1992 | Gillingham | 323/315 |

Primary Examiner—David R. Hudspeth
Assistant Examiner—Andrew Sanders

[57] ABSTRACT

Relatively constant current sources and current mirrors are formed with vertical bipolar transistors operated in the inverse mode. In one embodiment of the invention, an integrated circuit current mirror includes a dual collector vertical NPN bipolar transistor having first and second regions of one conductivity type defining first and second collector regions, respectively, formed within a common third region of opposite conductivity type defining the base of the transistor. The third region is formed within a fourth region defining the emitter of the transistor. The structure of the dual collector vertical transistor is very compact since the two collectors share the same base region which is embedded in a common emitter (inverse collector) pocket. The "inverse" mode vertical transistor can function as a relatively constant current source with a voltage drop (VCEi) across its collector-to-emitter which is substantially less than that of a bipolar transistor operated in a normal mode. Transistors embodying the invention may be used to provide relatively constant current sources to numerous utilization means, such as logic or analog circuits. Due to the low VCEi of the "inverse" mode transistor, the resultant circuits can be operated at a lower operating voltage than prior art circuits. This results in a decrease of power dissipation.

20 Claims, 9 Drawing Sheets

INTEGRATED CIRCUIT EMPLOYING INVERSE TRANSISTORS

FIELD OF THE INVENTION

This invention relates to constant current sources, and, more particularly, to bipolar transistor current sources and current mirrors.

BACKGROUND OF THE INVENTION

A problem exists in the production of a relatively constant current source with a very low voltage drop across the current source. The problem is best explained with reference to FIGS. 1A, 1B, and 2.

Figure 1A:
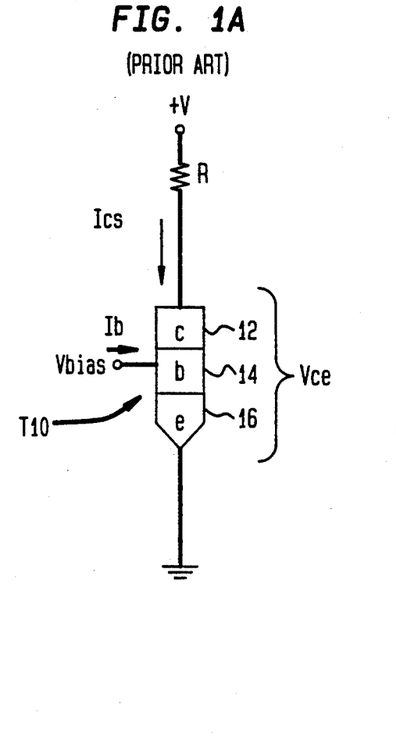
FIG. 1A shows a schematic diagram of a prior art circuit which includes a bipolar transistor operated in a "normal" mode.

Referring now to FIG. 1A, there is shown a prior art circuit consisting of a vertical n-p-n bipolar transistor T10 having an emitter e, 16, a base b, 14, and a collector c, 12, with the collector being connected via a resistor R to a positive voltage source +V, the emitter being connected to ground potential, and the base being connected to a source of bias voltage Vbias. Assuming that Vbias causes a constant base current (Ib) to be supplied to the base of transistor T10 in a direction to forward bias an base-to-emitter junction thereof, T10 operates in what is known as a "normal" mode whereby conventional (i.e., positive) current (Ics) flows from +V through R and via the collector and emitter of T10 to ground potential.

Figure 1B:
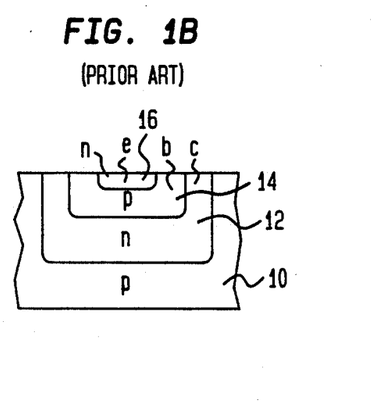
FIG. 1B shows a typical cross-sectional view of a semiconductor substrate which includes a transistor useful with the circuit of FIG. 1A.

Referring now to FIG. 1B, there is shown a cross-sectional view of a portion of a simplified view of a p-type conductivity semiconductor substrate 10 in which the vertical bipolar transistor T10 of FIG. 1A is formed. Within a portion of substrate 10 is a region 12 which is a region of n-type conductivity semiconductor material which has a region 14 of a p-type conductivity formed therein. Within a portion of region 14 is formed a region 16 of n-type conductivity. When a voltage is applied to region 12 which is more positive than the voltage applied to region 16, and when a base voltage and base current (Ib) are applied to region 14 to forward bias region 14 relative to region 16, positive current Ics flows from region 12 through region 14 and then into and through region 16. The current (i.e., the emitter current) flowing in region 16 is then the sum of Ics and Ib. With T10 so biased, it is operated in what is known in the art as the "normal" mode of operation. Applying a more positive voltage to region 12 than to region 16 and forward biasing region 14 relative to region 16 results in the normal mode of operation and results in regions 12, 14 and 16 being defined as the collector c, base b, and emitter e of T10. Regions 12 and 16 are both n-type conductivity regions, but they are not symmetrical with respect to region 14.

In the "normal" mode of operation, region 12, which surrounds the base region 14 and provides good current collecting efficiency, is biased to function as the collector of the transistor T10, and region 16, which is formed within the base region 14 and has a significantly smaller area than base region 14, is biased to function as the emitter of the transistor.

Figure 2:
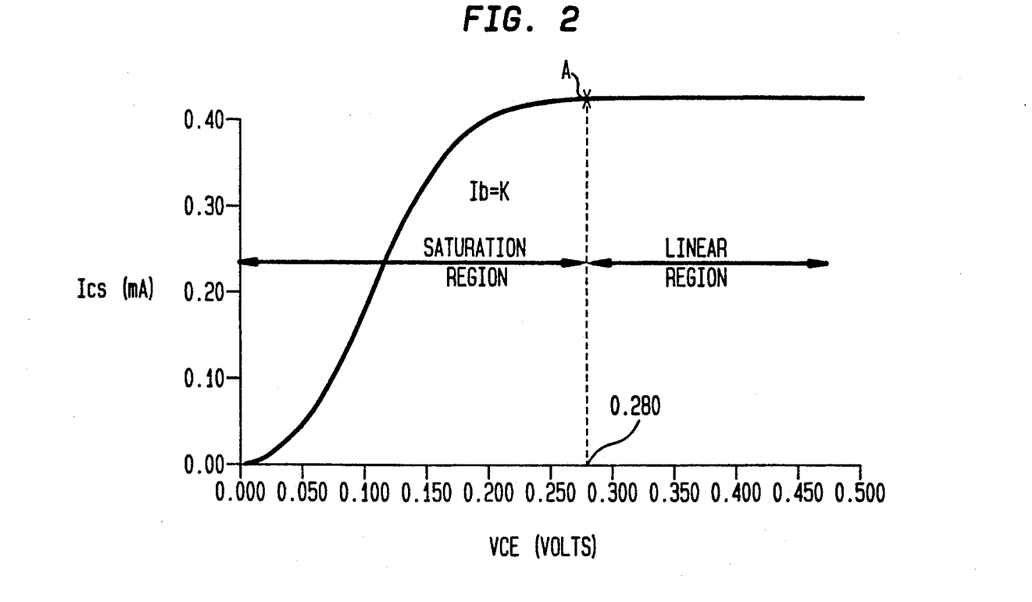
FIG. 2 shows a graphical representation of the transfer characteristic of the transistor of FIGS. 1A and 1B.

Referring now to FIG. 2, there is shown a graph of the collector current Ics (in milliamps) on the y-axis as a function of the collector-emitter voltage Vce (in volts) on the x-axis of T10 of FIG. 1A. As Vce applied across the transistor T10 increases from zero to the 200 to 250 millivolt range, the amplitude of Ics flowing between the collector and emitter varies (virtually) directly as a function of Vce. This range of transistor operation in which the base-to-collection junction is normally forward biased is known in the bipolar transistor art as the "saturation region". As Vce is increased above the 280 millivolt level (point A on the curve of FIG. 2), the current Ics increases very slightly with large increases of Vce. That is, Ics becomes relatively independent of Vce and the transistor T10 of FIG. 1A exhibits a high dynamic impedance and can then function as a relatively constant current generator or current source. The region of operation above point A is known in the bipolar transistor art as the "linear" region of operation. Thus, for the transistor T10 to function as a relatively constant current source with relatively large dynamic impedance, it must be operated in this "linear" region with a Vce of 280 millivolts or more.

As shown in FIG. 2, there must be a Vce of approximately 280 millivolts across the collector-to-emitter of T10 for it to function as a relatively constant current source. The 280 millivolts of collector-to-emitter voltage (also referred to herein as "Vcen") represents the voltage drop needed between the collector and emitter of an n-p-n bipolar transistor for it to function as a relatively constant current source when operated in the normal mode. Thus, where vertical bipolar transistors such as T10, operating in the normal mode, are designed and connected to function as current sources in circuit with other transistors, it is necessary that 280 millivolts of the power supply voltage be allotted as a voltage drop across the current source. This obviously limits the minimum value of power supply voltage that can be used to operate a circuit using these transistors. This is a significant problem in many applications since it is generally desirable to operate circuits at a lower power supply voltage to save power and reduce stress across the components of the circuits.

Another problem with prior art current sources formed as part of current mirrors is best explained with reference to a current mirror circuit shown in FIGS. 3 and 4.

Figure 3:
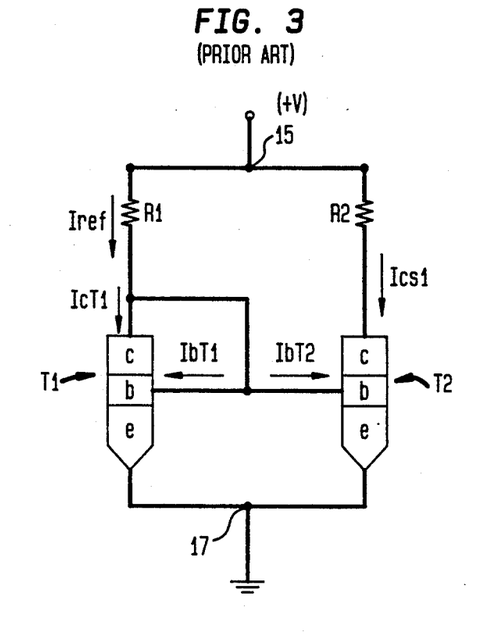
FIG. 3 shows a schematic diagram of a prior art current mirror employing bipolar transistors operated in a normal mode.

Referring now to FIG. 3, there is shown an electrical schematic of a prior art current mirror circuit in which an n-p-n transistor T1 is used to produce a reference current Iref and an n-p-n transistor T2 is used to function as a relatively constant current source of a current (Ics1). The circuit also includes resistors R1 and R2. Transistors T1 and T2 are connected to operate in a common emitter configuration and in the normal mode. Each one of transistors T1 and T2 has a base b, an emitter e and a collector c. The collector and base of T1 and the base of T2 are connected via a resistor R1 to a power terminal 15 to which is applied a positive operating potential of +V volts. The collector of T2 is connected via resistor R2 to the terminal 15. The emitters of T1 and T2 are connected to a power terminal 17 to which is applied ground potential. The base-to-emitter area of T2 is designed to be M times the base-to-emitter area of T1 so that the current source current Ics1 is equal to M times the reference current Iref (neglecting the effect of leakage currents).

The relationship between the reference current Iref and the current source current(Ics1) may be expressed as follows:

$$Iref = IcT1 + IbT1 + IbT2$$

where IcT1 is the collector current of T1, and IbT1 and IbT2 are the base currents of T1 and T2, respectively.

If T2=MT1 (i.e., the base-to-emitter area of T2 is M times that of T1); then: Ics1=Ic of T2=(M)(Ic of T1); assuming that the current gain of T2 is relatively high compared to 1.

Figure 4:
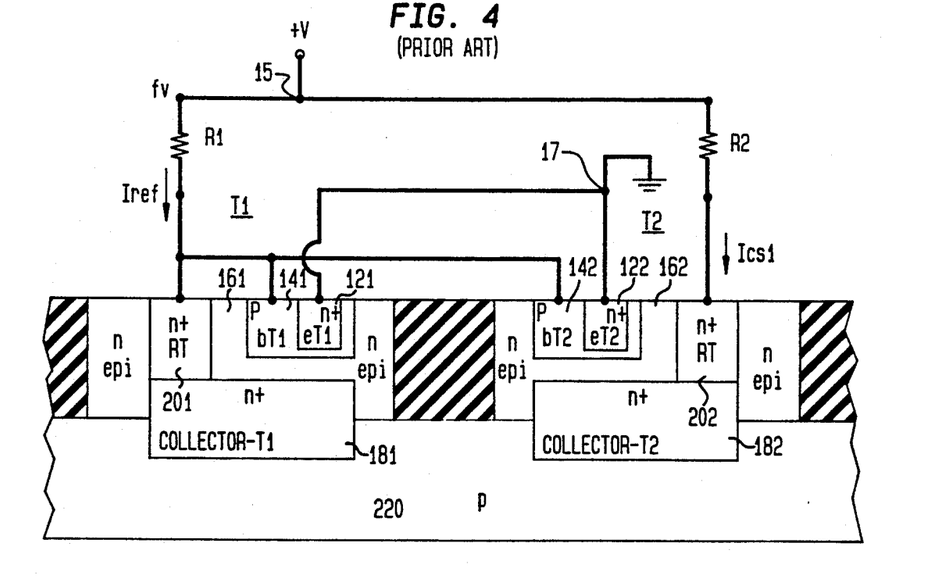
FIG. 4 shows a combination schematic and cross-sectional view of an integrated circuit implanting the current mirror of FIG. 3.

T1 and T2 are preferably vertical bipolar transistors formed and interconnected as shown in cross section in FIG. 4 so as to have T1 and T2 function effectively and efficiently as a current mirror and for T2 to function as a relatively constant current source.

Referring now to FIG. 4, there is shown a combination schematic and cross-sectional view of a prior art implantation of the transistors of the current mirror circuit of FIG. 3 in silicon technology. Transistors T1 and T2 are shown formed in portions of a semiconductor substrate 220 which is of p-type conductivity and in portions of an n-type epitaxial layer which is formed on a top surface of substrate 220 and are electrically isolated from each other by silicon dioxide regions. T1 and T2 are each vertical n-p-n transistors with each having an n+ type conductivity emitter (regions 121 and 122, respectively), a p-type conductivity type base (regions 141 and 142, respectively), and a collector region comprising a portion of the n-type epitaxial region and an n+ type conductivity sub-collector region with an n+ type conductivity reach through (RT) region extending to the collector (regions 161, 181, and 201 of T1, and regions 162, 182 and 202 of T2, respectively). As shown in FIG. 4, the collector of T1 is wire connected to the base (bT1) thereof and to the base of T2 (bT2). The emitter of T1 (eT1) and the emitter of T2 (eT2) are wire connected to ground. The collector of T1 is wire connected to R1 to pass Iref, and the collector of T2 is wire connected to R2 to pass Ics1. The resistors R1 and R2 and the connections thereto are typically formed on portions of substrate 220 which are not shown in FIG. 4.

To manufacture the current mirror shown in FIG. 4, each one of its transistors (i.e., T1 and T2) must be formed separately. That is, each one of transistors T1 and T2 must be formed with a separate n+ type conductivity sub-collector pocket and each transistor must be isolated (e.g., by dielectric isolation) from the other. Since T1 and T2 are interconnected as if they were two, separate, discrete transistors, and since they can not be integrated within a single collector region, a significant amount of silicon area and several wire connections are needed to form a current mirror with vertical bipolar transistors operating in the normal mode.

Thus, current mirrors formed in accordance with the prior art suffer from two significant problems. One problem is that for the transistors in the current mirrors to function as good current sources, the voltage (Vcen) across their collector-to-emitter must be equal to, or greater than, 280 millivolts. The other problem is that the reference and current source transistors can not be integrated or formed in one collector region.

It is desirable to form semiconductor current sources comprising bipolar transistors which do not require several hundred millivolts of voltage drop across their collector to emitter for the transistors to function as current sources, and to produce semiconductor current sources which can be formed using less silicon area than prior art circuits.

SUMMARY OF THE INVENTION

The present invention resides in part in the recognition that a transistor operated in the inverse mode can operate as a current source with a much lower voltage drop across its collector-to-emitter than when operated in the normal mode. It also resides in the recognition that a current mirror comprising a reference transistor and a current source transistor designed to operate in the inverse mode may be integrated in one collector pocket.

Viewed from one aspect, the present invention is directed to circuitry comprising first, second, third, and fourth semiconductor regions, and first, second, and third means. The first and second regions are separated and spaced apart semiconductor regions of one conductivity type formed within the third semiconductor region which is of a second conductivity type which is opposite the first conductivity type. The third region is formed within the fourth semiconductor region which is of the one conductivity type. The first and second regions are separated from the fourth region by the third region. The first means couples the first region to the third region. The second means supplies a reference current to the first region so as to cause a positive current to flow into the first region and through the third region and into the fourth region. The third means is coupled to the second region for enabling positive current flow which is proportional to the reference current to flow through the second region into the third region and then into the fourth region.

Viewed from another aspect, the present invention is directed to a combination. The combination comprises first and second power terminals for the application therebetween of an operating potential, a load element having first and second terminals for the application therebetween of an operating potential, and a relatively constant current source. The first terminal of the load element is coupled to the first power terminal. The relatively constant current source, which is coupled between the second terminal of the load element and the second power terminal, comprises a vertical bipolar transistor operated in the inverse mode with a inverse emitter (collector) thereof coupled to the second terminal of the load element terminal, and with an inverse collector (emitter) thereof coupled to the second power terminal. The voltage drop between the inverse emitter and the inverse collector is substantially less than the voltage drop therebetween when the transistor is operated in a normal mode.

Viewed from still another aspect, the present invention is directed to a current mirror circuit. The current mirror comprises first and second bipolar transistors. The first and second bipolar transistors are of the same conductivity type. Each transistor has first and second regions defining the ends of a main conduction path and a base. Each transistor, when operated in the normal mode with the base forward biased with respect to the first region by a constant current and with the second region at a potential which is positive with respect to the first region, exhibits in the "linear" region a voltage between the first and second region denoted as VCEn, and each transistor, when operated in an inverse mode with the base thereof forward biased with respect to the second region by a constant current and with the first region at a potential which is positive with respect to the second region, exhibits in the "linear" region a voltage between the first and second regions denoted as VCEi, where VCEi is substantially less than VCEn. The current mirror further comprises means interconnecting the first and second transistors for operating them in the inverse mode and further comprises: (a) means for connecting the second region of said first and second transistors to a point of reference potential; (b) means connecting the bases of said first and second transistors in common to the first region of said first transistor; (c) means for supplying a first reference current to the first region of the first transistor; and (d) means coupled to the first region of the second transistor for conducting a current which is proportional to the amplitude of the first reference current.

The present invention also resides in circuits utilizing current mirrors and current sources formed with transistors operated in the inverse mode.

The invention will be better understood from the following more detailed description taken with the accompanying drawings and claims.

BRIEF DESCRIPTION OF THE DRAWINGS

In the accompanying drawing like reference characters denote like components.

DETAILED DESCRIPTION

Figures 5A, 5B:
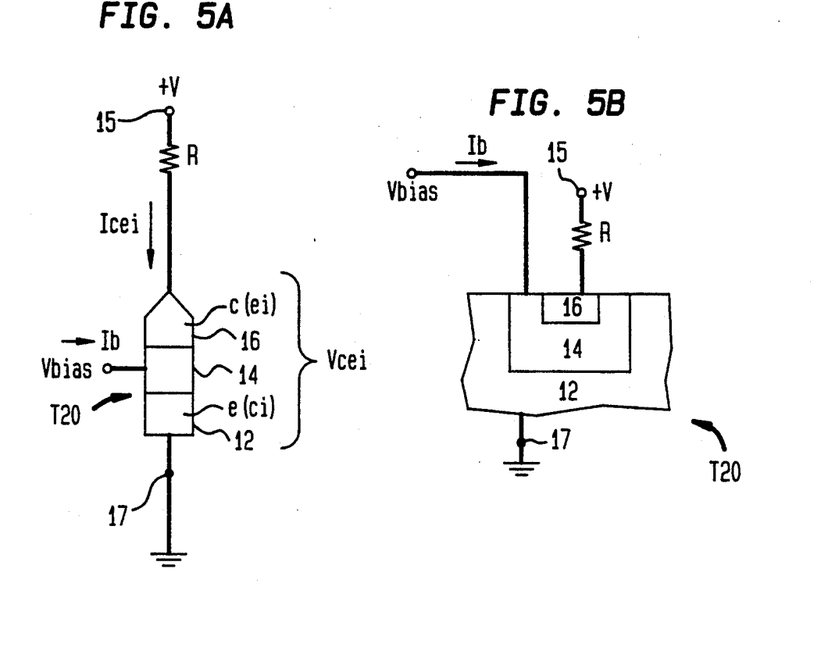
FIG. 5A shows a schematic diagram of a bipolar transistor operated in the inverse mode.
FIG. 5B shows a cross sectional view of the bipolar transistor of FIG. 5A and biasing means.

Referring now to FIG. 5A, there is shown a vertical n-p-n transistor T20 biased to operate in an inverse mode with a resistor R in accordance with the present invention. A transistor operated in the inverse mode can be made to function as a relatively constant current source with a lower Vce than when operated in the normal mode. In the inverse mode of operation, what is normally the emitter region of a transistor is biased to become the collector and what is normally the collector region of a transistor is biased to become the emitter. Accordingly, to operate the transistor shown in FIG. 1B in the inverse mode, it would be biased as shown in FIG. 5B. That is, region 16 is biased to be at a voltage which is positive relative to region 12, and the base region 14 is forward (positively) biased relative to region 12 whereby base current flows from region 14 into region 12. The resulting transistor T20 operates in the inverse mode with region 16 serving as a collector, region 12 serving as an emitter, and region 14 continuing to serve as the base of the transistor. Thus, in contrast to the "normal" biasing of the transistor structure of FIG. 1B which is used with the configuration of FIG. 1A, it is possible to operate the structure of FIG. 1B in the "inverse" mode with a more positive voltage being applied to region 16 than to region 12, as is shown in FIGS. 5A and 5B. With region 16 at a positive voltage relative to region 12, and with the voltage and current into region 14 being poled to forward bias region 14 relative to region 12, positive current flows from region 16 through region 14 and into region 12. Region 16 is denoted as the collector (or "inverse emitter"), region 12 is denoted as the emitter (or "inverse collector"), and region 14 is still denoted as the base of transistor T20 which is a vertical bipolar transistor operating in the "inverse" mode. Due to the asymmetrical nature of the structure of T20 (i.e., the area of the "collector" region 16 is substantially less than the area of the "emitter" region 12), this mode of operation is defined as the "inverse" mode.

The resistor R is connected between a terminal 15, to which is applied a source of positive potential of +V volts, and the collector (inverse emitter ei) of T20. A bias voltage (Vbias) is applied to the base (b) of T20 and the emitter (inverse collector, ci) of T20 is returned to ground (terminal 17). When a current Icei (Icsi) flows from +V via R and the emitter-to-collector path of T20 to ground, a voltage drop is developed across the emitter-to-collector path of T20 which is denoted herein as Vcei, where Vcei represents the collector-to-emitter drop for the transistor T20 operated in the inverse mode.

As noted above, a significant aspect of operating a bipolar transistor in the inverse mode is that its Vcei is typically much lower than its Vcen when operating in the normal mode.

Figure 6:
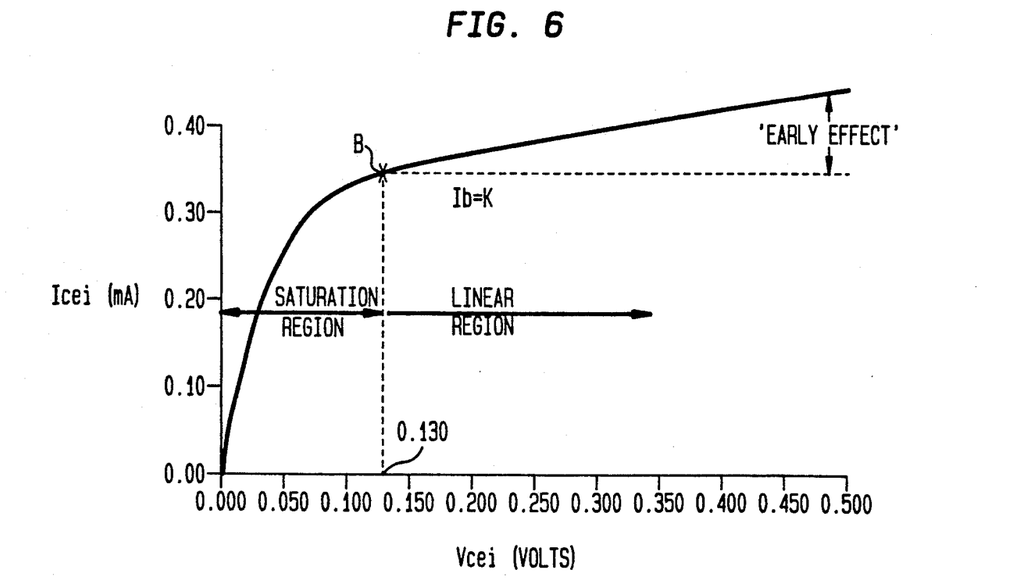
FIG. 6 shows a graphical representation of the transfer characteristics of the transistor of FIG. 5.

Referring now to FIG. 6, there is shown a graph of the collector-emitter Icei (or, Icsi) current in milliamps on the y-axis vs. the collector-to-emitter voltage Vce (or Vcei) on the x-axis for a constant base current Ib applied to the base of the transistor T20. For values of Vce between zero and 130 millivolts, Icei varies directly as Vce varies. As Vce exceeds 130 millivolts, Icei (Icsi) rises very slowly as a function of Vce and becomes relatively constant. Thus, when transistor T20 is operated in the inverse mode, it acts as a relatively constant current source with a Vcei of approximately 130 millivolts thereacross. The importance of this feature is that it permits the operation of circuits at lower operating voltages than with transistors operated in the "normal" mode.

Applicants have discovered that transistors operated in the inverse mode can be used to produce a current mirror which functions as a relatively constant current source with a very small voltage drop across the current source and have further discovered that these transistors can be formed as portions of an integrated circuit in a relatively small area of semiconductor material.

Figure 7:
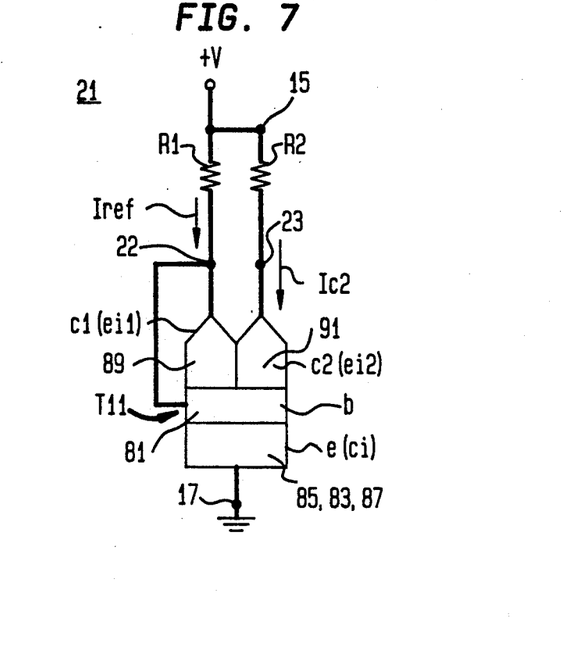
FIG. 7 shows a schematic diagram of a current mirror circuit in accordance with the present invention.

Referring now to FIG. 7, there is shown a relatively constant current source circuit 21 in accordance with the present invention. Circuit 21 comprises a vertical bipolar transistor T11 operated in the inverse mode and resistors R1 and R2. T11 has a first collector c1 (also denoted as inverted emitter ei1), a separate second collector c2 (also denoted as inverted emitter ei2), a base b, and an emitter e (also denoted as an inverted collector ci). A resistor (load element) R2 (which is shown as a resistor but which can be any one of a number of digital, linear or switching circuits) is connected at one terminal to c2 of T11 and to a terminal 23, and at a second terminal thereof to the terminal 15. The base b and first collector c1 of T11 are coupled to a first terminal of resistor R1 and to a terminal 22. Resistor R1 is connected between the terminal 22 and the terminal 15 to which is applied an operating potential of +V volts. The emitter e(ci) of T11 is coupled to a terminal 17 and to ground potential. The circuit 21 differs from the circuit shown in FIG. 3 in that a single dual collector transistor T11 replaces transistors T1 and T2, and T11 is operated in an "inverse" mode while T1 and T2 of FIG. 3 are operated in a "normal" mode.

Figure 8:
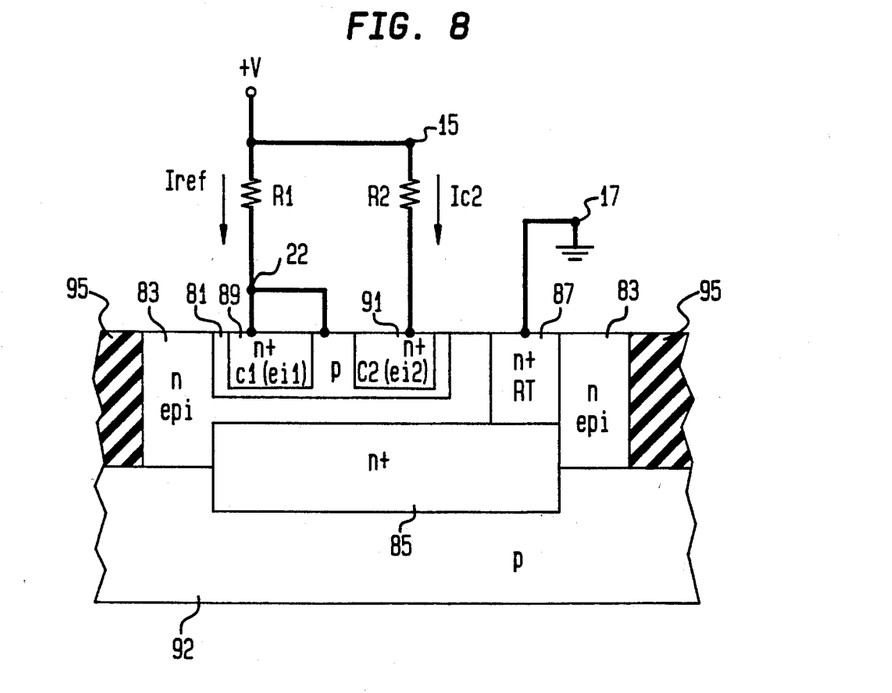
FIG. 8 shows a combination schematic and cross-sectional view of the current mirror circuit of FIG. 7.

Referring now to FIG. 8, there is shown a partial electrical schematic and a partial cross-sectional diagram of an integrated semiconductor circuit showing an implementation of the circuit 21 in a semiconductor body which is in an illustrative example silicon. The structure comprises a semiconductor substrate 92 of p-type conductivity with an n-type conductivity epitaxial layer 83 formed thereon. A deep buried n+ type conductivity region 85 is formed at an interface of the substrate 92 and the epitaxial layer 83. An reach-through n+ type conductivity region 87 extends from a top surface of epitaxial layer 83 down to region 85 and facilitates ohmic contact to region 85. Epitaxial layer 83, region 85 and reach-through region 87 form the emitter e (also denoted a the inverse collector ci) of T11. Within a portion of epitaxial layer 83 and extending from a top surface thereof is a region 81 of p-type conductivity which serves as the base of T11. Separated n+ type conductivity regions 89 and 91 are formed within a portion of base region 81 and extend from a top surface thereof. Regions 89 and 91, which serve as the first collector c1 (ei1) and second collector c2 (ei2), respectively, of T11, are separated by portions of region 81 from each other and from regions 83 and 85. A p+ type conductivity region (not shown) is typically included within a portion of region 81 to facilitate ohmic contact thereto. This contact region is omitted in order to simplify the drawing. Thus dual collector vertical bipolar transistor T11 has one base region 81, an emitter region formed of regions 83, 85 and 87, and separate collector regions 89 and 91. A dielectric layer 95, having an opening which includes a portion of epitaxial layer 83, serves to electrically isolate T11 from other transistors and elements (not shown) that are typically formed in other parts of substrate 92.

The first and second collectors c1 and c2 of T11 are connected via R1 and R2, respectively, to +V volts. The first collector c1 (ei1) of T11 is also connected via a conductor connection to the base region 81 of T11. The emitter e (inverse collector ci) comprised of regions 83, 85, 87 of T11 is returned via a conductor connection to terminal 17 and to ground potential. Thus, in sharp contrast to the prior art structure of FIG. 4, vertical bipolar transistor T11 has two separate collector regions which share one base region and one emitter region. This common sharing provides a substantial saving of the silicon area needed to form a current mirror as compared to the area needed to form the current mirror shown in FIG. 4. In addition, it should be appreciated that dual collector transistor T11 can function as relatively constant current source with a Vce(i) of approximately 130 millivolts. Still further, the conductor connections needed from base-to-base (i.e., bT1 to bT2) and from emitter-to-emitter (i.e., eT1 and eT2 to ground) in FIG. 4 have been eliminated.

An examination of FIG. 6 reveals that for values of Vcei greater than 130 millivolts, Icei increases slowly as a function of increasing Vcei due to the "EARLY EFFECT". That is, the current gain (beta) of the transistor operated in the inverse mode increases as Vcei increases whereby Icei increases for Ib equal to a constant k. Although the transistor operated in the inverse mode behaves as a reasonably good current source, this variation is undesirable. To compensate for this variation and stabilize the selected operating point of the reference transistor, the reference transistor is preferably biased, as is shown in FIG. 9.

Figure 9:
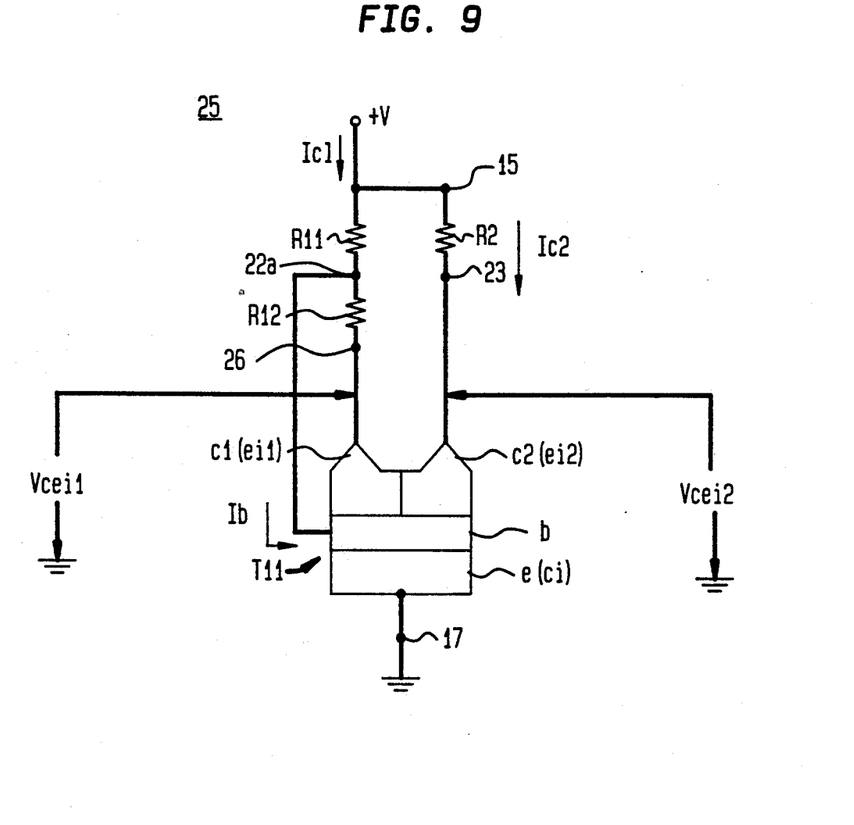
FIG. 9 shows a schematic diagram of another current mirror in accordance with the present invention.

Referring now to FIG. 9, there is shown a constant current source circuit 25 in accordance with the present invention. Circuit 25 comprises a bipolar transistor T11 and resistors R11, R12 and R2. Transistor T11 is a dual collector bipolar transistor which operates in an inverse mode and has a first collector c1 (also denoted as inverted emitter ei1), a separate second collector c2 (also denoted as inverted emitter ei2), a base b, and an emitter e (also denoted as an inverted collector ci). The resistor (load element) R2 (which is shown as a resistor, but which can be any one of a number of other elements such as an emitter coupled pair of transistors) is connected between a terminal 15 and a terminal 23 which is connected to c2. The first collector c1 of T11 is connected to a terminal 26. Resistor R12 is connected between terminal 26 and a terminal 22a, and resistor R11 is connected between terminals 22a and 15. The base of T11 is connected to terminal 22a. An operating potential of +V volts is applied to terminal 15. The emitter e(ci) of T11 is coupled to a terminal 17 and to ground potential. The structure of circuit 25 of FIG. 9 is very similar to that of circuit 23 of FIG. 7 except that the resistor R1 of FIG. 7 has been replaced by the series combination of resistors R11 and R12 and the base of T11 is coupled to the common terminal 22a between R11 and R12.

The values of R11, R12 and R2 are selected to cause the voltages, Vceil, at the collector c1 of T11, to be nearly equal to the voltage, Vcei2, at the collector c2 of T11. For this condition, the current (Ic2) flowing through the second collector-to-emitter path of T11 is equal to M times the current (Ic1) flowing through the first collector-to-emitter of T11, where the common surface area (the junction of c2 and b) of the second collector c2(ei2) to the base b of T11 is M times the common surface area (the junction of c1 and b) of the first collector c1(ei1) to the base of T11.

The values of R11 and R12 are also selected to set and stabilize the operating point of T11 and regulate the current Ic1. For selected values of R11 and R12, a certain base current (Ib) is designed to flow into the base of T11 and a certain Ic1 is designed to flow into the first collector c1 (ei1). For this current condition, a certain voltage is developed at terminal 22a. If the Ic1 current tends to increase, the voltage at terminal 22a decreases. This produces less base current into T11 which T11 to draw less current and reestablishes the preset value of Ic1. Likewise, if Ic1 tends to decrease, the voltage at terminal 22a increases. This causes more base current to flow into T11 which causes more Ic1 current to flow to reestablish the designed value. Hence, R12 provides negative feedback to stabilize the operating point.

Figure 10A:
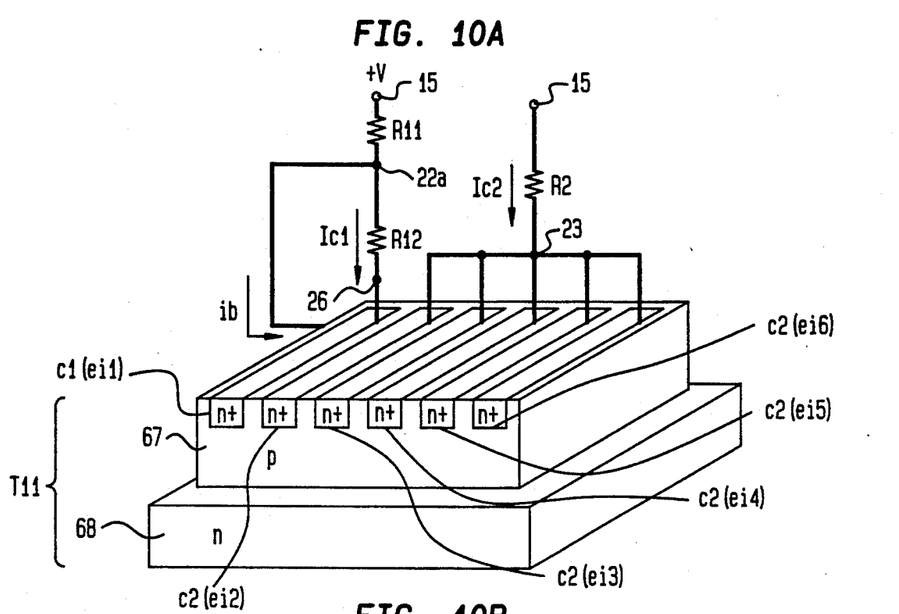
FIG. 10A shows a schematic and isometric view of one embodiment of the current mirror of FIG. 9.
Figure 10B:
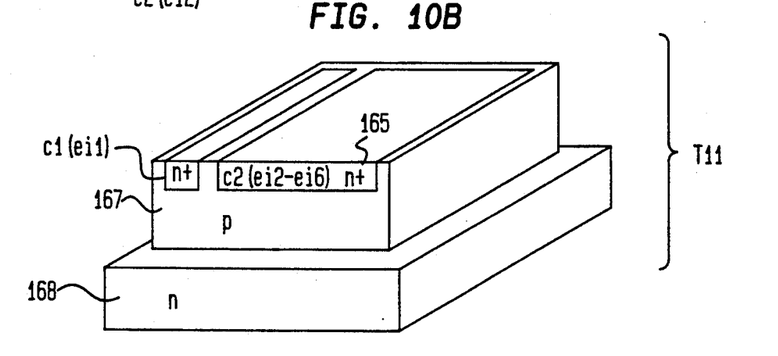
FIG. 10B shows schematic and isometric view of another embodiment of the current mirror of FIG. 9.

Transistor T11 may be manufactured as shown in FIGS. 10A and 10B.

Referring now to FIG. 10A, there is shown in schematic form the resistors R11, R12 and R2 and an isometric view of the basic structure of vertical n-p-n transistor T11. T11 comprises an n-type conductivity emitter (inverse collector) region 68, a p-type conductivity base region 67, a first collector (inverse emitter) c1(ei1) region, and a second collector (inverse emitter) which comprises five separated regions c2(ei2), c2(ei3), c2(ei4), c2(ei5) and c2(ei6) which are connected together to form the second collector of T11. The second collector regions are separated from each other and from the first collector region by portions of the base region 67. Resistor R12 is connected between c1(ei1) which is connected to terminal 26 and terminal 22a. The base region 67 is connected to terminal 22a and resistor R11 is connected between terminal 22a and terminal 15 to which is applied +V volts. Each of the five collectors c2 (inverse emitters ei2 to ei6) which form the second collector of T11 are connected to terminal 23. A load element represented symbolically by resistor R2 is connected between terminals 23 and 15.

Where the areas of each of the collector regions ei1–ei6 are equal to each other (i.e., the emitter-to-base areas of the separate regions are all equal), the current Ic2 is five times the current Ic1.

Referring now to FIG. 10B, there is shown an alternative embodiment of the transistor structure of FIG. 10A of T11. Second collector regions c2(ei2–ei6) have been combined into a single collector region 165. This results in a significant reduction in the size of the construction of T11. Applicants recognized that the emitter of T11 could be formed with a single second collector region, 165, instead of five separate second collector regions which are connected together via conductors. This reduction in the area required by the second collector region 165 allows for a corresponding reduction in the base region 167 which allows a corresponding reduction in the collector region 168. Accordingly, the overall area of T11 is reduced.

Figure 10C:
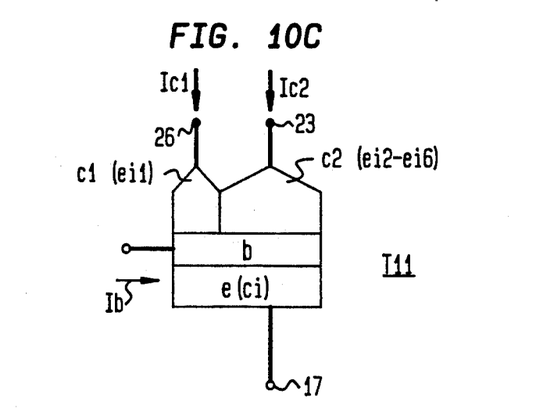
FIG. 10C shows a schematic diagram representation of the transistors of FIGS. 10A and 10B.

Referring now to FIG. 10C, there is shown a symbol for the transistor T11 structures of FIGS. 10A and 10B. Collector c2 (ei2–ei6) is shown to be larger than C1 (ei1) so as to indicate that the collector-base area of c2 is greater than the collector-base area of c1.

Figure 11:
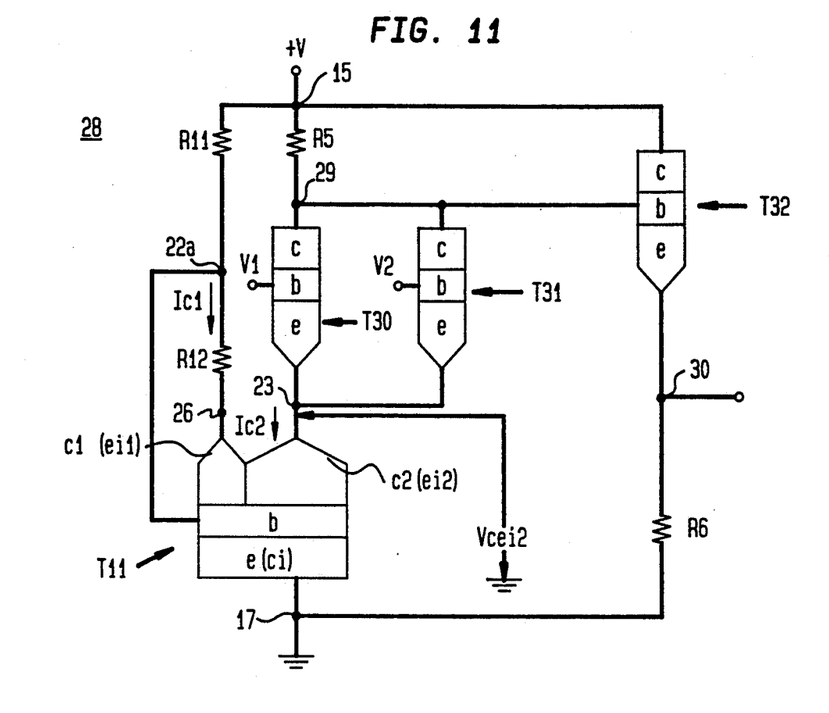
FIG. 11 shows a schematic diagram of a NOR gate in accordance with the present invention.

Referring now to FIG. 11, there is shown a two input NOR gate 28 in accordance with the present invention. NOR gate 28 comprises the current mirror of FIG. 9 with T11 being the symbol shown in FIG. 10C and further comprises n-p-n transistors T30, T31 and T32 connected and operated in the normal mode, and resistors R5 and R6. T30, T31 and R5 represent an alternate embodiment which is substituted for resistor R2 of FIG. 9.

Emitters of T30 and T31 are coupled together to the terminal 23 and to the second collector of T11. Collectors of T30 and T31 are coupled to a base b of T32, to a first terminal of R5, and to a terminal 29. A second terminal of R5 and a collector of T32 are coupled to the terminal 15. An emitter of T32 is couped to a first terminal of R6 and to an output terminal 30 of NOR gate 28. A second terminal of R6 is coupled to the terminal 17. A base of T30 serves as a first data input signal terminal V1 of NOR gate 28. A base of T31 serves as a second data input signal terminal V2 of NOR gate 28.

T11, R11 and R12 act to facilitate the generation of a current Ic2 and a current Ic1. Ic2 is M times the magnitude of Ic1 where the base-collector area of the second collector c2 is M times the area of the base-to-first collector c1.

If V1 or V2, or both are high, a logical "1", then one or both of T30 and T31 are biased on. A current (Ic2) then flows from +V through R5 and the biased on one, or both, of T30 and T31 and into c2 and through the base and emitter thereof and then into terminal 17 and to ground potential. This current Ic2 through c2 and the base and emitter of T11 is relatively constant (being a multiple of the reference current Ic1 into c1) and flows with a voltage drop, Vcei2, between the second collector c2 and the emitter e of T11 of about 130 millivolts. It also results in a voltage drop across R5. T32 acts as an emitter follower and the voltage at terminal 29 is transferred to output terminal 30 with a drop of the emitter-base voltage of T32. This is a low output signal, a logical "0". If both V1 and V2 are logical lows, "0's", then T30 and T31 are biased off and no current flows through them. The voltage of terminal 29 is then close to +V and the resulting voltage at output terminal 30 is approximately +V less the Vbe of T32, a high, a logical "1".

Transistors T30, T31 and T32 are operated in the normal mode. Because of the small voltage drop (i.e., 130 millivolts) needed across T11 for it to operate as a relatively constant current source, the operating voltage +V across the logic circuit may be made as low as 2.5 volts.

The relatively constant current (Ic2) produced and flowing into the second collector c2 of T11 establishes the voltage of the logic level at terminal 29 when T30 and/or T31 conduct. This also establishes the logic level produced at the emitter of T32 (the output terminal 30). Thus, T11 functions to produce a relatively constant current which maintains or establishes the appropriate signal level conditions.

The use of the "inverse" current mirror in the logic circuit of FIG. 11 illustrates another significant advantage of the "inverse" current source. For example, assume that input signals V1 and V2 are "low" such that T30 and T31 are nonconducting. For this signal condition, there is no current flowing from T30 or T31 into the second collector of T11. Since base current is provided into T11 from terminal 22a, T11 is driven into "saturation". When V1 or V2 goes "high", current flows into the second collector of T11 and it is driven out of "saturation" and into the "linear" region of operation. Due to their structure, bipolar transistors operated in the inverse mode have very little minority charge storage and can switch, or be switched, from the saturation region to the linear region very quickly. Thus, transistor T11 can switch very quickly from the saturation region to the linear region when T30 and/or T31 are "turned-on". Thus, the "inverse" current source transistor T11 facilitates lower power dissipation due to the lower operating potential and permits faster operation.

Figure 12:
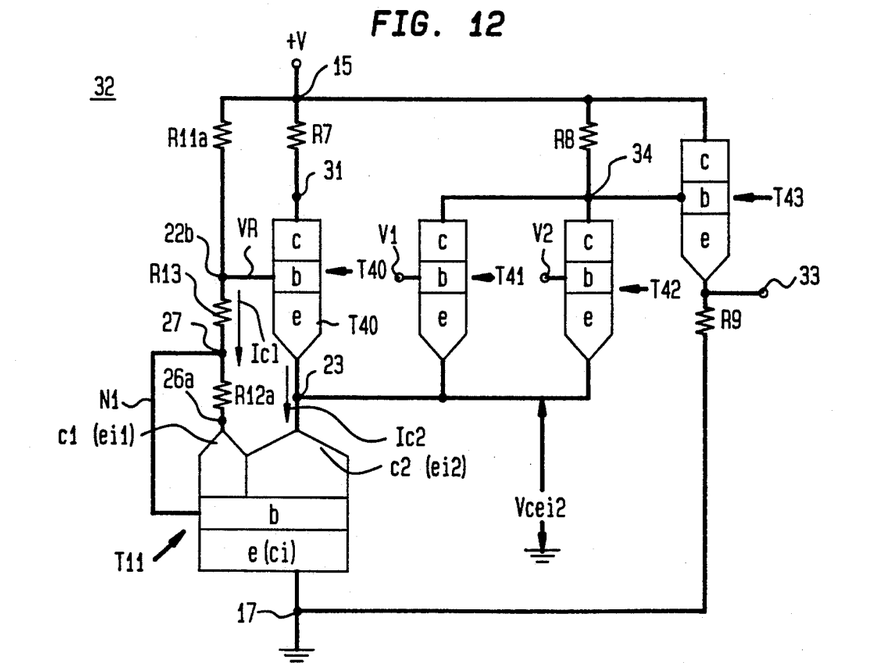
FIG. 12 shows a schematic diagram of an emitter coupled logic (ECL) circuit in accordance with the present invention.

Referring now to FIG. 12, there is shown another two input NOR gate 32 in accordance with the present invention. NOR gate 32 comprises n-p-n transistors T40, T41, T42 and T43, resistors R7, R8, R9, R11a, R12a, and R13, and the constant current source circuit 25 of FIG. 9 with resistors R11a and R12a substituted for R11 and R12 of the constant current source circuit 25 of FIG. 9, and with T40, T41, T42 and R7 and R8 substituted for R2 of the constant current source circuit 25 of FIG. 9. T11 is shown using the symbol shown in FIG. 10C. Emitters of T40, T41, and T42 are coupled to terminal 23. A collector of T40 is coupled to a first terminal of R7 and to a terminal 31. Collectors of T41 and T42 are coupled to a first terminal of R8, to a base of T43, and to a terminal 34. Second terminals of R7 and R8 and a collector of T43 are coupled to terminal 15 and to +V. An emitter of T43 is coupled to a first terminal of R9 and to an output terminal 33 of NOR gate 32. A second terminal of R9 is coupled to terminal 17. A base of T40 is coupled to a terminal 22b which is held at a relatively fixed voltage which serves as a reference voltage for T40. The resistor R13 is connected between terminals 22b and 27 to decouple the voltage VR applied to the base of T40 from the base voltage of T11. As in the circuit 28 of FIG. 11, T11 is biased to produce a current Ic2 with a voltage drop across the second collector c2 of T11 of about 130 millivolts. T40, T41, T42 and T43 all operate in the normal mode.

Input data signals are applied to V1 and V2. If one of V1 or V2 or both are a high, a "1", then current flows from +V through R8 and the one or both of T41 and T42, which are biased on, into c2 and then through the base and emitter of T11 and to terminal 17 and ground potential. If both V1 and V2 received a low, a "0", then T41 and T42 are biased off and T40 is biased on. This results in current flow from +V through R7 and T40 and into c2, and the base and emitter of T11 and into terminal 17 and ground potential. Output terminal 33 serves as the output of NOR gate 32 with T43 serving as an emitter follower. With a "1" applied to V1 or V2 or to both, the resulting current flow through R8 lowers the voltage at terminal 34 and thus the voltage at output terminal 33 to a "0". If both V1 and V2 are "0's", then there is no current flow through R8 and the voltage at output terminal 33 is one emitter-base voltage below +VR, an output "1".

With T11 functioning as a relatively good current source with a low voltage between c2 and the emitter thereof, the operating potential (+V) for the circuit 32 of FIG. 12 may be as low as 2.5 volts. Also, since T11 functions as a relatively constant current source, the current source current can be switched between T40 and T41/T42 and well defined voltage levels are maintained at output terminal 33.

Figure 13:
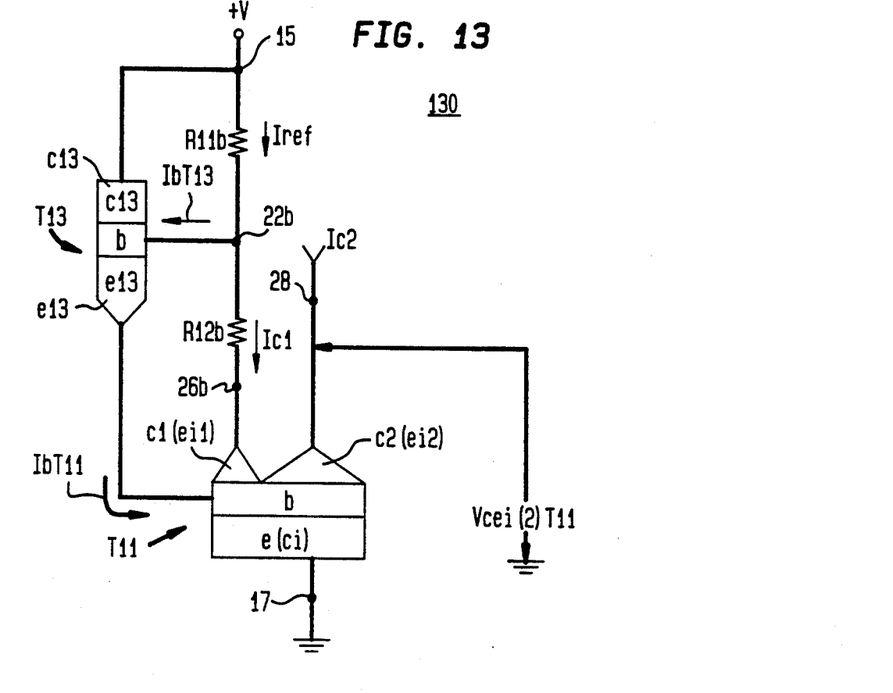
FIG. 13 shows a schematic diagram of another current mirror circuit in accordance with the present invention.

Referring now to FIG. 13, there is shown a circuit 130 in accordance with the present invention for significantly reducing the adverse effect on the accuracy of the current mirror resulting from the low current gain of transistors operated in the inverse mode. The circuit 130 comprises resistors R11b and R12b and transistors T11 and T13. Resistor R11b is connected between a terminal 15 to which is applied +V volts and a terminal 22b; and resistor R12b is connected between terminal 22b and a terminal 26b. Transistor T11, which operates in the inverse mode, has a first collector c1(ei1) thereof connected to terminal 26b and has a second collector c2(ei2) connected to a terminal 28, and has an emitter e(ci) thereof connected to a terminal 17 to which is applied ground potential. Transistor T13 operates in the normal mode with a collector c13 thereof connected to terminal 15, a base thereof connected to terminal 22b, and an emitter thereof connected to the base of T11.

Transistor T13 supplies base current to T11. That is, the collector to emitter current of T13 supplies the base current (IbT11) into the base of T11. A reference current (Iref) flowing into terminal 22b equals the base current (IbT13) of T13 and the collector current Ic1 into c1(ei1) of T11. Since the base current into T13 is approximately equal to the base current of T11 divided by the forward current gain of T13, where T13 is operated in the normal mode and its current gain (beta) may be a hundred or more, virtually all of Iref flows into the first collector of T11. Therefore, the effect of the low current gain (inverse beta) of transistor T11 operated in the inverse mode, which tends to reduce the accuracy of the current mirror, is significantly reduced, if not eliminated.

As discussed above with respect to FIG. 9, transistors operated in the inverse mode have a pronounced "EARLY EFFECT" in that their collector to emitter current (Icei) increases, although the base current is maintained constant, as a function of an increase in their collector to emitter voltage (Vcei).

Figure 14:
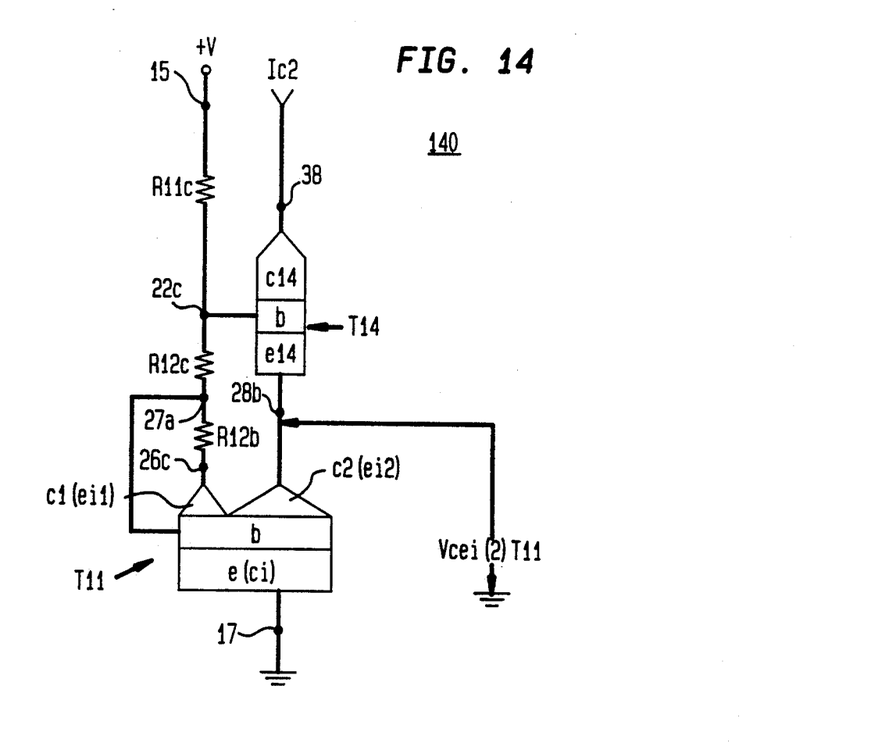
FIG. 14 shows a schematic diagram of another current mirror circuit in accordance with the present invention.

Referring now to FIG. 14, there is shown another circuit 140 in accordance with the present invention for maintaining Vcei of T11 across current mirror transistor T11 relatively constant and thereby reducing increases in Icei. The circuit 140 comprises resistors R11c, R12b, and R12c, and transistors T11 and T14. Resistor R11c is connected between a terminal 15 to which is applied +V volts and a terminal 22c; and resistor R12c is connected between terminal 22c and a terminal 27a; and resistor R12b is connected between terminal 27a and a terminal 26c which is connected to c1 of T11. Transistor T11 operates in the inverse mode with a first collector c1(ei1) thereof connected to terminal 26c and to a base thereof, a second collector c2(ei2) thereof is connected to a terminal 28b, and an emitter e(ci) thereof is connected to terminal 17 to which is applied ground potential. Transistor T14 also operates in the inverse mode and has a collector (inverse emitter) c14 thereof connected to a terminal 38, a base thereof connected to terminal 22c, and an emitter (inverse collector) e14 thereof connected to terminal 28. The function of the circuit 140 is to supply a relatively constant current Ics to a load (not shown) connected to terminal 38.

Transistors T14 and T11 are biased to conduct at a certain level and a fixed current flows through the collector c2 of T11 and a Vcei2 is established between a collector c2 thereof and an emitter thereof which is grounded. Resistor R12b serves to set the voltage of terminal 26c close to the voltage of terminal 28b. A change in the voltage at the collector of T14 is reflected in a change in the collector to emitter of T14. But, the emitter voltage of T14, which corresponds to the voltage at the second collector c2(ei2) of T11, is not affected. Therefore, since the Vcei2 of T11 does not change appreciably, its collector current remains relatively constant.

Figure 15:
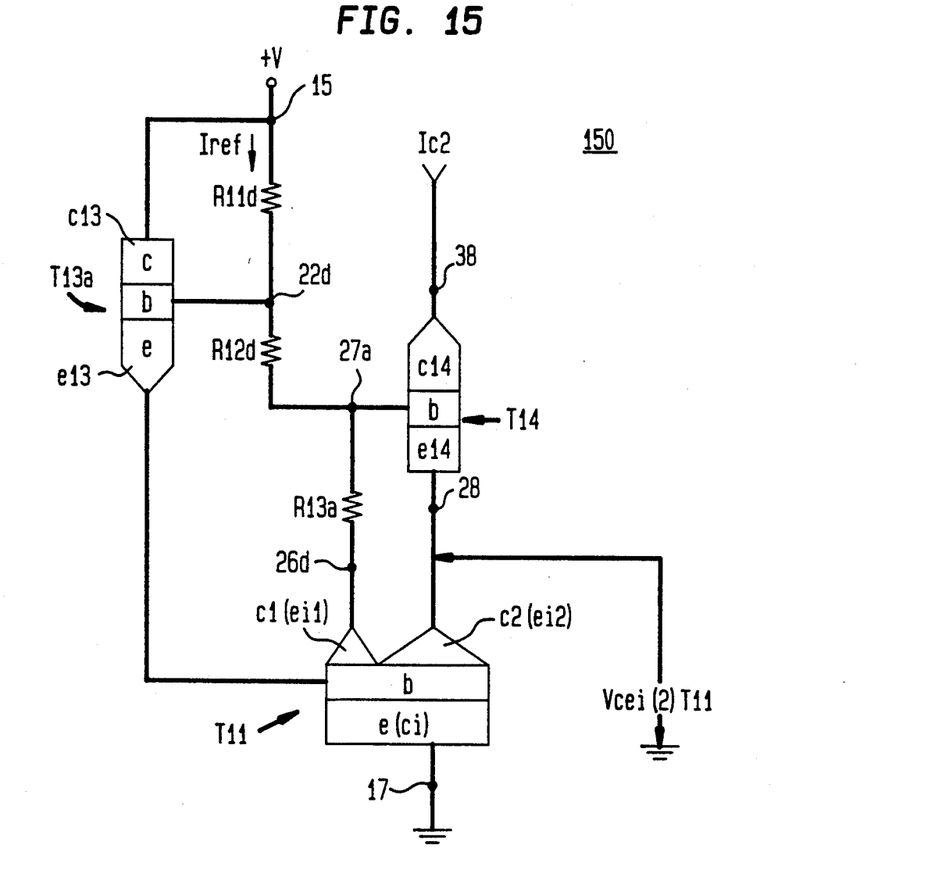
FIG. 15 shows a schematic diagram of another current mirror circuit in accordance with the present invention.

Referring now to FIG. 15, there is shown a circuit 150 in accordance with the present invention in which both the "Early Effect" correcting circuit 140 of FIG. 14 and the low current gain correcting circuit 130 of FIG. 13 have been combined to resolve the two problems simultaneously. The circuit 150 comprises resistors R11d, R12d, and R13a and transistors T11, T13a and T14. Resistor R11d is connected between a terminal 15 to which is applied +V volts and a terminal 22d; and resistor R12d is connected between terminals 22d and 27a. Resistor R13a is connected between terminal 27a and the first collector c1 of T11 which is connected to terminal 26d. T13a is connected at a collector c13 thereof to terminal 15, at a base thereof to terminal 22d, and at an emitter e13 thereof to the base of T11. T14 is connected at a collector c14 thereof to terminal 38, at a base thereof to terminal 27a, and at an emitter e14 thereof to terminal 28. The second collector c2 of T11 is connected to terminal 28, and the emitter e(ci) thereof is connected to terminal 17 which is at ground potential.

Transistor T13a functions to reduce the deleterious effect of the low current gain of T11 as explained with respect to circuit 130 of FIG. 13. At the same time, T14, in combination with its base bias network and T11, functions to absorb any increase in the voltage at terminal 38 whereby Vcei2 between c2 of T11 and ground remains relatively constant and a relatively constant current is drawn by the second collector-to-emitter of T11.

A significant aspect of the circuit 150 is that it may be used in conjunction with any number of different loads connected to terminal 38. That is, a logic gate or a linear/analog circuit may be connected to terminal 38 and have the benefit of a relatively constant current source requiring a very small voltage thereacross.

The embodiments described herein are intended to be illustrative of the general principles of the invention. Various modifications employing these principles may be devised by those of ordinary skill in the art without departing from the spirit of the invention. For example, other types of constant current sources which use bipolar transistors in output circuits thereof can be modified so as to use inversely operating transistors so as to facilitate lower power supply voltage magnitudes and to thus reduce power dissipation. Still further, the current mirror of the invention comprising vertical bipolar transistors operated in the inverse mode can be used in conjunction with any circuit and is particularly beneficial with those circuits requiring a relatively constant current source operable at a very low voltage.

What is claimed is:

1. Circuitry comprising:
    first and second separated and spaced apart semiconductor regions of one conductivity type formed within a third semiconductor region of a second conductivity type which is opposite the first conductivity type;
    the third region being formed within a fourth semiconductor region of the one conductivity type;
    the first and second regions being separated from the fourth region by the third region;
    first means for coupling the first region to the third region;
    second means for supplying a reference current to the first region so as to cause a positive current to flow into the first region and through the third region and into the fourth region; and
    third means coupled to the second region for enabling positive current flow which is proportional to the reference current to flow through the second region into the third region and then into the fourth region.

2. The circuitry of claim 1 wherein the second means comprises resistive means connected between the first region and a first power terminal.

3. The circuitry of claim 2 wherein:
    the third means comprises a load transistor operated in a normal mode;
    the load transistor having a base, an emitter and a collector;
    the collector of the load transistor being coupled to the first power terminal;
    the emitter of the load transistor being coupled to said second region;
    fourth means for applying a signal to the base of the load transistor for selectively enabling the load transistor; and
    the second, third and fourth regions being configured to function as a relatively constant current source for the current flowing through the load transistor.

4. The circuitry of claim 2 wherein the third means comprises a logic circuit having at least one signal input, one signal output, a first terminal connected to the first power terminal and a second terminal connected to said second region.

5. The circuitry of claim 2 wherein:
    a surface area of a junction between the second and third regions is M times a surface area of a junction between the first and third regions; and
    current flowing through the second, third and fourth regions during operation of the circuitry is M times current flowing said first, third and fourth regions.

6. The circuitry of claim 1 wherein the second means comprises:
    current amplitude control means connected between the first region and the first power terminal and means for connecting the fourth region to a second power terminal; and
    fifth means for applying an operating potential between the first and second power terminals with the potential applied to the first power terminal being positive relative to the potential applied to the second power terminal.

7. The circuitry of claim 6 wherein the third means comprises a load coupled between the second region and the first power terminal.

8. The circuitry of claim 6 wherein:
    the load is a logic circuit having first and second terminals for the application therebetween of an operating potential;
    the first terminal of the logic circuit is connected to the first power terminal and the second terminal of the logic circuit is connected to the second region; and
    the logic circuit comprises input signal means and an output terminal at which signals are produced responsive to signals applied to the input signal means.

9. Current source circuitry comprising:
    a vertical bipolar transistor structure comprising first and second separate and spaced apart regions of a first conductivity type formed within a third region of a second conductivity type which is opposite that of the first conductivity type, the third region being formed within a portion of a fourth region of the first conductivity type;
    the first and second regions being separated from each other and from the fourth region by portions of the third region;

the vertical bipolar structure being adapted to be operated such that positive current flows from the first and second regions through the third region and into the fourth region;

the first region being coupled to the third region and to first means for supplying current to the first region;

the second region being coupled to a load terminal to which a load element is connectable;

a common surface area of the second and third regions being a multiple of a common surface area of the first and third regions such that with a load element connected to the load terminal, a current level is selectively established during operation of the circuitry through the load element and through the second, third and fourth regions which is a multiple of the current flowing from the first region into the third and fourth regions.

10. In combination:

first and second power terminals for the application therebetween of an operating potential;

a load element having first and second terminals for the application therebetween of an operating potential;

the first terminal of the load element being coupled to the first power terminal; and a relatively constant current source coupled between the second terminal of the load element and the second power terminal comprising a vertical bipolar transistor operated in the inverse mode with an inverse emitter (collector) thereof coupled to the second power terminal, the voltage drop between the inverse emitter and the inverse collector being substantially less than the voltage drop therebetween when the transistor is operated in a normal mode;

in which said relatively constant current source comprises:

a reference transistor having a base, an inverse emitter (collector) and an inverse collector (emitter) with the base and inverse collector of the reference transistor being common to the base and inverse collector, respectively, of the vertical bipolar transistor;

means coupled between the first power terminal and the inverse emitter of the reference transistor for supplying a reference current into the inverse emitter and via an inverse emitter-to-inverse collector path of the reference transistor to the second power terminal; and means coupled between the inverse emitter of the reference transistor and its base.

11. The combination of claim 10 wherein the load element is a logic circuit having at least two input signal means and an output signal means and which comprises at least one transistor operated in the normal mode having an emitter thereof connected to the second terminal of the load element and a collector thereof coupled to the first power terminal.

12. A current mirror comprising:

first and second bipolar transistors of the same conductivity type, each transistor having first and second regions defining the ends of a main conduction path and a base, and each transistor, when operated in the normal mode with the base forward biased with respect to the first region by a constant current and with the second region at a potential which is positive with respect to the first region, exhibits in the "linear" region a voltage between the first and second region denoted as VCEn, and each transistor, when operated in an inverse mode with the base thereof forward biased with respect to the second region by a constant current and with the first region at a potential which is positive with respect to the second region, exhibits in the "linear" region voltage between the first and second regions denoted as VCEi, where VCEi is substantially less than VCEn; and means interconnecting the first and second transistors for operating them in the inverse mode comprising:

(a) means for connecting the second region of the first and second transistors to a point of reference potential;

(b) means connecting the bases of the first and second transistors in common to the first region of the first transistor;

(c) means for supplying a first reference current to the first region of the first transistor; and (d) means coupled to the first region of the second transistor for conducting a current which is proportional to the amplitude of the first reference current.

13. The current mirror of claim 12 wherein:

the first and second transistors are n-p-n bipolar transistors; and

VCEn is typically greater than 200 millivolts and VCEi is typically less than 200 millivolts for the same value of current flowing between the first and second regions.

14. The current mirror of claim 12 wherein:

the means interconnecting the first and second transistors for operating them in the inverse mode comprises first and second power terminals for the application therebetween of an operating potential;

the means for supplying a first reference current to the first region of the first transistor comprises current amplitude control means connected between the first region of the first transistor and the first power terminal; and the means for connecting the second regions of the first and second transistors to a point of reference potential comprises means connecting the second regions to the second power terminal.

15. The current mirror of claim 14 wherein:

the current amplitude control means comprises first and second resistors connected in series;

the junction of the first and second resistors defines a terminal; and the means connecting the bases of the first and second transistors in common to the emitter of the first transistor comprises of a connection between the terminal and the bases.

16. The current mirror of claim 14 wherein:

the means coupled to the first region of the second transistor comprises a load transistor operated in the normal mode;

the load transistor having a base, an emitter and a collector;

the collector of the load transistor being coupled to the first power terminal;

the emitter of the load transistor being coupled to the first region of the second transistor;

means for applying a signal to the base of the load transistor; and the second transistor functions as a relatively constant current source for the current flowing in the load transistor.

17. The current mirror of claim 14 wherein the means coupled to the first region of the second transistor comprises a logic circuit having at least one signal input, one signal output, a first terminal connected to the first power terminal and a second terminal connected to the first region of the second transistor.

18. The current mirror of claim 14 wherein a base-to-first region area of the second transistor is M times a base-to-first region area of the first transistor such that during operation of the current mirror current flowing between the first and second regions of the second transistor is M times current flowing between the first and second regions of the first transistor.

19. Circuitry comprising:
first and second transistors operated in the inverse mode, each transistor having a base, an inverse emitter region and an inverse collector region; the base region of the first and second transistors being connected together, and the inverse collector region of the first and second transistors being connected in common and to a first terminal; a third transistor having a base, an emitter and a collector;
means connecting the base of the third transistor to the inverse emitter region of the first transistor;
means connecting the emitter of the third transistor to the bases of the first and second transistors; and
means for supplying a reference current to the base of the third transistor and the inverse emitter of the first transistor for producing an output current at the inverse emitter of the second transistor which is proportional to the reference current.

20. The circuitry of claim 19 further comprising:
a fourth transistor operated in the inverse mode, the first transistor having a base, an inverse collector region (emitter) and an inverse emitter region (collector);
the base of the fourth transistor being coupled to the inverse emitter region of the first transistor;
the inverse collector region of the fourth transistor being coupled tot he inverse emitter region of the second transistor; and
means for driving an output current via the inverse emitter region of the fourth transistor.

* * * * *